United States Patent
Kase et al.

(10) Patent No.: US 7,088,363 B2
(45) Date of Patent: Aug. 8, 2006

(54) STORAGE METHOD OF SUBSTANTIAL DATA INTEGRATING SHAPE AND PHYSICAL PROPERTIES

(75) Inventors: Kiwamu Kase, Wako (JP); Hideo Tashiro, Wako (JP); Ryutaro Himeno, Wako (JP); Akitake Makinouchi, Wako (JP)

(73) Assignee: RIKEN, Saitama (JP)

( * ) Notice: Subject to any disclaimer, the term of this patent is extended or adjusted under 35 U.S.C. 154(b) by 178 days.

(21) Appl. No.: 10/058,905

(22) Filed: Jan. 30, 2002

(65) Prior Publication Data

US 2002/0135577 A1 Sep. 26, 2002

(30) Foreign Application Priority Data

Feb. 1, 2001 (JP) ............................. 2001-025023

(51) Int. Cl.
*G06T 17/00* (2006.01)
(52) U.S. Cl. ..................................... 345/424
(58) Field of Classification Search ................. 345/424
See application file for complete search history.

(56) References Cited

U.S. PATENT DOCUMENTS

| 4,694,404 A | | 9/1987 | Meagher | |
|---|---|---|---|---|
| 5,197,013 A | * | 3/1993 | Dundorf | 700/182 |
| 5,517,602 A | * | 5/1996 | Natarajan | 345/419 |
| 6,075,538 A | * | 6/2000 | Shu et al. | 345/419 |
| 2003/0001836 A1 | * | 1/2003 | Ernst et al. | 345/419 |

FOREIGN PATENT DOCUMENTS

JP 2002-230054 8/2002

OTHER PUBLICATIONS

Hierarchcal octree approximations for boundary representation-based goemetric models. Ajay Kela. Computer-Aided Design, 1989.*
Computer-Integrated Manufacturing of Surfaces Using Octree Encoding. K. Yamaguchi and T. L. Kunii. IEEE Computer Graphics and Applications, vol. 1, No. 1, Jan. 1981.*
Gary Shute. Overview of C Programming. Aug. 1999. pp. 1-7. http://www.d.umn.edu/~gshute/C/overview.html.*
D. Ayala et. al. Object Representation by Means of Nonminimal Division Quadtrees and Octrees. ACM Transactions on Graphics. vol. 4, Issue 1. Jan. 1985. p. 41-59.*

(Continued)

*Primary Examiner*—Ulka Chauhan
*Assistant Examiner*—Peter-Anthony Pappas
(74) *Attorney, Agent, or Firm*—Griffin Szipl, P.C.

(57) ABSTRACT

A method of storing substantial data integrating shape and physical properties comprising (A) inputting external data 12 consisting of boundary data of an object 1, (B) dividing, by modified Octree division, the external data into cubical cells 13 which boundary surfaces are orthogonal to each other, and (C) storing the values of various physical properties for each of the cells. Furthermore, in step (B), each of the divided cells 13 is classified to non-boundary cells 13a located in the interior of the object or in a region outside of the object, and boundary cells 13b including boundary surfaces. Thereby, substantial data integrating shape and physical properties can be stored in small storage capacity, thus enabling the integration of CAD and simulation.

16 Claims, 7 Drawing Sheets

OTHER PUBLICATIONS

Tang Zesheng, "Octree Representation and Its Applications in CAD." J. of Comput. Sci. & Technol. (Eng. Lang. Edition) vol. 7, No. 1 (1992), pp. 29-38.

Ajay Kela, "Hierarchical octree approximations for boundry representation-based geometric models." Computer Aided Design. vol. 21, No. 6 (1989), pp. 355-362.

European Search Report in corresponding EP 02 00 2407 completed on May 28, 2003 and mailed Jun. 11, 2003.

William E. Lorensen et al., Marching Cubes: A High Resolution 3D Surface Construction Algorithm, Computer Graphics Jul. 1987, pp. 163-169, vol. 21, No. 4.

K. Kase et al., Volume CAD, Volume Graphics, 2003, 7 pages, published by the Eurographics Association.

K. Kase et al., Volume CAD—CW-complexes based approach, Computer-Aided Design (in press).

Developing Volume-CAD as the basis for next generation manufacturing, RIKEN News, Mar. 2005, 9 pages, at www.riken.go.jp/engn/r-world/info/release/news/2005/mar/.

Office Action regarding EP Application No. 02 002 407.1-1225, European Patent Office, dated Jan. 1, 2004, 6 pages.

Response to the Summons to attend Oral Proceedings of Mar. 16, 2005, dated May 6, 2005, regarding EP Application No. 02 002 407.1-1225, 7 pages.

Partial English machine translation, including paragraph [0033], of JP 2002-230054, provided by the Japanese Patent Office, 4 pages.

R.S. Avila et al., A Haptic Interaction Method for Volume Visualization, Proceedings of the Visualization Conference, IEEE, XP-000704188, 1996, pp. 197-204.

U. Roy et al., Computation of a Geometric Model of a Machined Part from its NC Machining Programs, Computer-Aided Design, vol. 31, 1999, pp. 401-411.

* cited by examiner

Fig.3
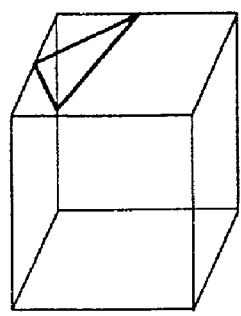
MC1
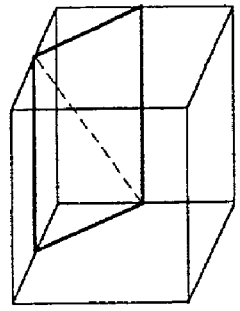
MC2
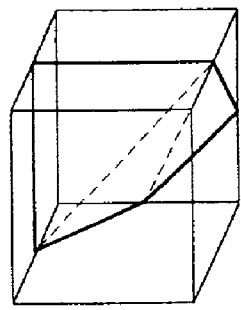
MC5
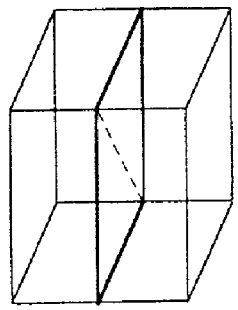
MC8
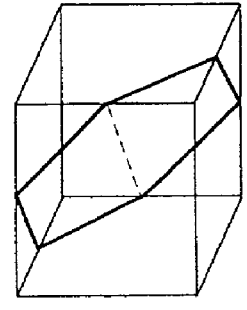
MC9

STORAGE METHOD OF SUBSTANTIAL DATA INTEGRATING SHAPE AND PHYSICAL PROPERTIES

BACKGROUND OF THE INVENTION

1. Field of the Invention

The present invention relates to a method of storing substantial data that can store substantial data pertaining to integrating shape and physical properties in a small storage capacity so as to integrate CAD and simulation processes.

2. Description of the Related Art

In the field of high technology research and development, due to increases in sophistication and complexity, an enormous amount of trial and error has been necessary which increases risk of error in the course of technology development. For a country aiming at developing science and technology, it is very important to minimize these development risks and to achieve increased sophistication with greater efficiency of the development process.

At present, in the field of computer research and development, simulation means, such as Computer Aided Design (abbreviated CAD), Computer Aided Manufacturing (abbreviated CAM), Computer Aided Engineering (abbreviated CAE), and Computer Aided Testing (abbreviated CAT), are used for simulating design, work, analysis, and test situations, respectively. On the other hand, less commonly used simulation means include C-Simulation (Corporation Simulation) of continuous simulation, A-CAM (Advanced CAM) considering work process, and D-fabrication (Deterministic fabrication) providing ultimate accuracy.

For conventional simulation means such as listed above, object data is stored by Constructive Solid Geometry (abbreviated CSG) or by Boundary Representation (abbreviated B-rep). However, because CSG stores the whole data corresponding to an object as an assembly of fine solid models, the data required is massive. Thus, when installing simulation means via software, an enormous amount of data must be handled by the computing system, thereby resulting in a time problem even with the use of a high speed computer. Such large amounts of data take much time for analysis.

In the alternative, B-rep methods represents object data by boundaries; therefore, less data is required which is less burdensome on the computing system. However, B-rep has a limitation in that it is not suitable for deformation analysis because the interior of the boundary plane must be treated uniformly.

Furthermore, conventional data storage means divides an object into meshes suitable for analysis, and then applies a finite-element method to these meshes, as is required in heat and fluid analysis, large deformation analysis of solids, continuous analyses and the like. Consequently, although the results of the analyses can be displayed, it is difficult to integrate CAD and simulation methods so there is a problem in that each process of design, analysis, work, assembly and testing can not be managed under the same common data construct.

In other words, in view of the current state of Solid/Surface-CAD (hereinafter, referred to as "S-CAD"), there have been the following problems:

(1) Data can not be used commonly in different software applications because the technology does not provide for data conversion;

(2) S-CAD can not be used for simulation directly because it does not have internal information; thus, the generation of meshes is required; and (3) S-CAD can not be used to study machining by CAM because S-CAD addresses only final shapes.

Furthermore, S-CAD has the following problems with respect to machining applications:

(1) S-CAD can not represent work processes. It is a method insufficient to support rough machining and process design applications;

(2) S-CAD is not suited to new machining techniques such as laser beam machining and high technology machining. Conventional S-CAD is suited only to cutting applications, and has poor accuracy with regards to numerical values; and (3) S-CAD does not allow the selection of machining techniques when working with a complex material having different properties therein.

SUMMARY OF THE INVENTION

The present invention endeavors to overcome these problems. That is, an object of the present invention is to provide a method of storing substantial data, wherein the method enables storing substantial data integrating shape and physical properties in a small storage capacity, thereby allowing the management of shape information, structure information, physical-property information, and history of matter information in an integrated manner. The method of storing substantial data, in accordance with the present invention, also allows the management of data associated with a series of processes from design processes to work processes, assembly processes, test processes and evaluation processes using the same data, thus allowing integration of CAD and simulation methods.

The present invention provides a method of storing substantial data integrating shape and physical properties, comprising (a) an external data input step (A) for inputting external data 12 consisting of boundary data of an object (1); (b) an Octree division step (B) for dividing, by Octree division, the external data 12 into cubical cells 13, which boundary surfaces are orthogonal to each other; and (c) a cell data storage step (C) for storing the values of various physical properties for each of the cells.

According to a preferred embodiment of the present invention, in the Octree division step (B), each of the divided cells is classified as one of the following: (a) non-boundary cells 13a located in the interior of the object or in the region outside of the object, and (b) boundary cells 13b including boundary surfaces.

Moreover, the boundary cells 13b are re-divided by Octree division until acquiring cut points sufficient to enable the reconstruction of boundary shape elements that make up the boundary surfaces included in the external data.

Furthermore, each non-boundary cell 13a has one kind of physical property value as its attribute, whereas each boundary cell 13b has two kinds of physical property values corresponding to the interior and exterior (i.e., outside) of the solid.

Furthermore, the physical property values consist of constant values, which do not change during simulation, and variables, which do change as a result of simulation.

Still further, the external data 12 is provided in the following forms: polygon data representing a polyhedron, a tetrahedron or a hexahedron element for a finite-element method; curved surface data for a three dimensional CAD or CG tool application; or data for representing the surface of another solid provided as information comprising partial planes and curved surfaces.

According to the method of storing substantial data of the present invention described above, external data 12 can be stored into a small storage space in the form of a hierarchy of cubical cells. These cubical storage cells are obtained by dividing the external data of the object 12 into the cubical cells with orthogonal boundary surfaces by using Octree division. Also, as each cell stores various physical properties as its attributes, it becomes possible to manage shape information, structure information, physical-property information, and history of matter information in an integrated manner. It also becomes possible to manage data associated with a series of processes from design processes to work processes, assembly processes, test processes and evaluation processes using the same data, thus allowing the integration of CAD and simulation processes.

In other words, because the method of storing substantial data of the present invention can store and represent not only object data, but also physical attributes as well, it is possible to construct advanced simulation technology and interface technology between human and matter, using the hierarchical data utilized in the present invention as the platform.

Another object of the present invention is to provide a method of storing substantial data that permits the common usage of C-Simulation (Corporation Simulation) of continuous simulation, A-CAM (Advanced CAM) considering work process, and D-fabrication (Deterministic fabrication) with improved accuracy.

Other objects and advantageous characteristics of the present invention will become apparent from the following description with reference to the accompanying drawings.

BRIEF DESCRIPTION OF THE DRAWINGS

FIG. 3 shows examples of interpolating curved-surface in accordance with the present invention.

DESCRIPTION OF PREFERRED EMBODIMENT

Hereinafter, a preferred embodiment of the present invention will be described with reference to the drawings.

Figure 1:
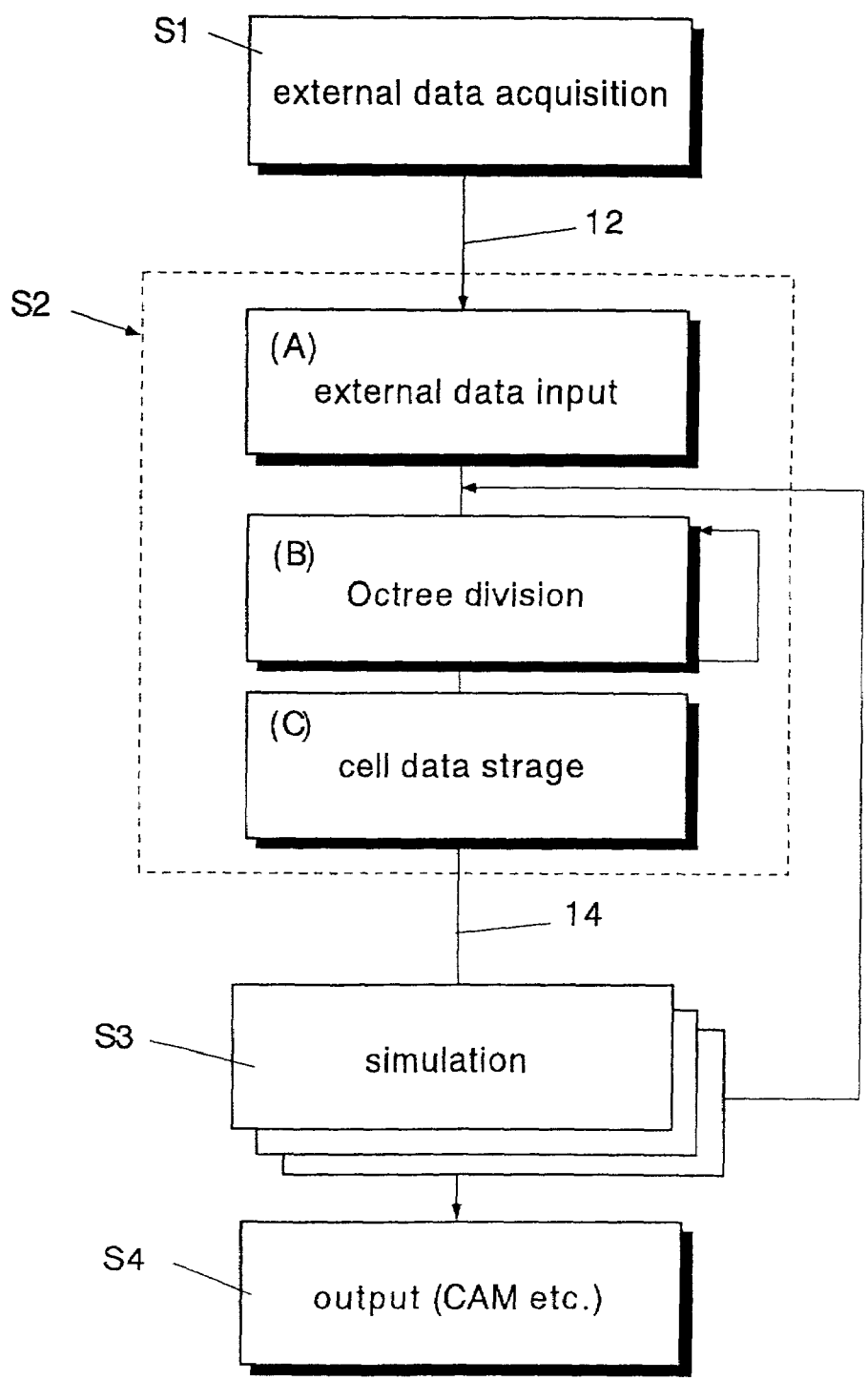
FIG. 1 is a flow chart showing steps of a method of storing substantial data in accordance with one embodiment of the present invention.

FIG. 1 shows a flow chart illustrating steps of a method of storing substantial data according to the present invention. The method of storing substantial data in accordance with the present invention comprises the following steps: (a) an external data input step (A); (b) an Octree division step (B); and (c) a cell data storage step (C). As shown in FIG. 1, steps (A), (B) and (C) are sub-steps of step S2.

In the external data input step (A), external data 12, consisting of boundary data of the object 1, is input to a computer. The external data 12 is gathered in an external data acquisition step S1. The computer performing the storing substantial data method of the present invention is provided with the method stored therein. In the Octree division step (B), the external data 12 is divided by modified Octree division into cubical cells 13 whose boundary surfaces are orthogonal to each other as shown in FIG. 7B. In the cell data storage step (C), the values of various physical properties for each of the cubical cells 13 are stored. Hereinafter, the hierarchical data stored in accordance with the method of the present invention will be referred to as "V-CAD data", and the design or simulation using such V-CAD data will be referred to as "Volume CAD" or "V-CAD".

As shown in FIG. 1, corresponding to the method of storing substantial data in accordance with the present invention, in step S2, the modified Octree division sub-step (B) may be repeated as required. Furthermore, in step S3, simulation, such as design simulation, analysis simulation, work simulation, assembly simulation, and test simulation, are performed using V-CAD data 14. The results of the simulation step S3 are preferably outputed to output step S4, where the results are outputted as CAM or polygon data.

The external data 12 gathered in the external data acquisition step S1 is externally inputted in external data input sub-step (A) as any of the following: (i) polygon data representing a polyhedron, a tetrahedron, or a hexahedron element used for a finite-element method; (ii) curved surface data used for a three dimensional CAD or CG tool; or (iii) data used for representing the surface of the other solids in the form of information comprising partial planes and curved surfaces.

In addition to such forms of data (also referred to as "S-CAD data"), the external data 12 may take the form of Volume data that also has internal information such as (1) data directly input by a person using a V-CAD-specific interface (also referred to as a "V-interface"), (2) digitized surface data such as that obtained by measuring instruments, sensors, and digitizers, (3) voxel data used for CT scanner, MRI, and general Volume rendering technologies.

Figure 2:
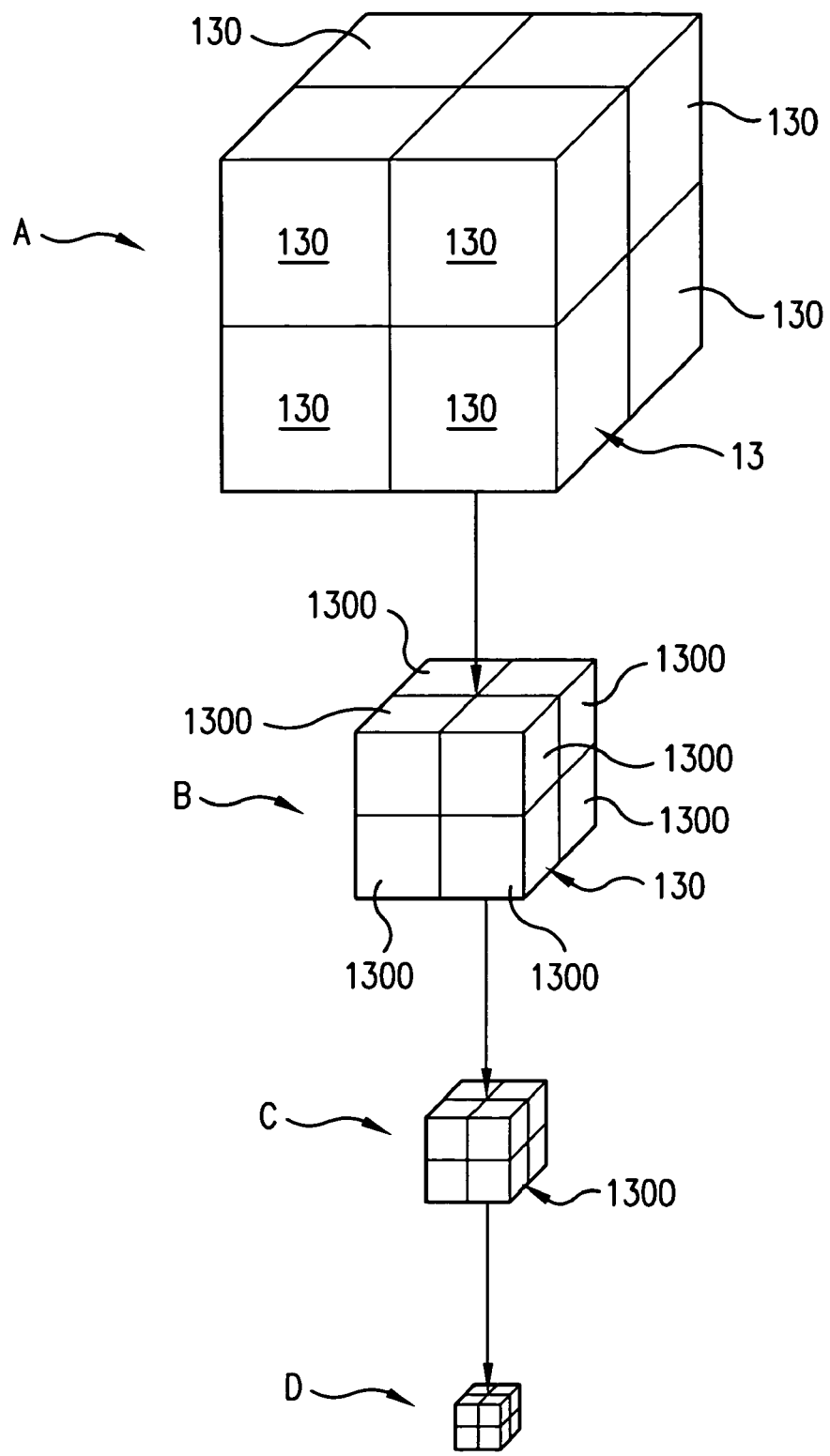
FIG. 2 is a diagrammatic representation of the hierarchical data structure according to the present invention.

FIG. 2 is a diagrammatic representation of the hierarchical data structure according to the present invention. In the Octree division sub-step (B) described above, space division is performed by modified Octree division. Octree representation, (i.e., space division by Octree), divides a reference cube 13 containing an object into 8 cell regions 130, and recursively repeats this 8 cell region division process until the solid is wholly contained in each of the cell regions, or not contained therein, as shown in (A), (B), (C), (D) of FIG. 2. In other words, Octree division takes the reference cube 13 and divides it into 8 cell regions 130, then takes each cell region 130 and further divides it into 8 sub-cell regions 1300, and then takes each sub-cell region 1300 and further divides it into 8 regions and so on until the solid is wholly contained, or not contained, by the divisions. This Octree division method can reduce the amount of data required to represent an object more greatly than voxel representation.

Thus, a space region obtained by the division of space based on Octree division is referred to as a cell. So, cube 13 is divided into 8 cells 130, and each cell 130 is divided into 8 cells 1300, and so on. Each cell is a cube whose boundary planes are orthogonal to each other as shown in FIG. 2. The hierarchical structure based on these cells uses the number of divisions to represent regions occupied in space in order to achieve resolution. This hierarchical structure enables an object to be represented in the whole space as the accumulation of cells of different sizes.

In other words, using the Octree division step (B), the physical properties of the interior and boundaries of an object are transformed from the external data 12 into substantial data 14 (i.e., V-CAD data) as described below. The boundary data, for example a plane, can be strictly reconstructed by 3 points included therein. In the alternative, the boundary data can be chosen within a designated allowable difference such as a position difference, a tangential line difference, a normal difference, a curvature difference, and the threshold difference designated for connectivity with adjacent parts thereof.

FIG. 3 shows examples of interpolating curved-surface, which is an example of choosing boundary data within a designated allowable difference. A special case of interpolating curved-surface is the iso-surface used in Marching Cube methods. In accordance with the present invention, the division process is repeated until a cell can be represented by a cut point on a ridge line, or until the cell satisfies normal, main curvature, and connectivity conditions. Examples MC1, MC2, MC5, MC8 and MC9 of iso-surfaces in the Marching Cube, shown in FIG. 3, can be applied to the present invention.

Furthermore, only geometric eigen-amount (eigen-value) is maintained using strict representation for quadratic surfaces, whereas approximation by intra-cell curved surface based on a quadratic surface is used for free curved-surfaces.

Figure 4:
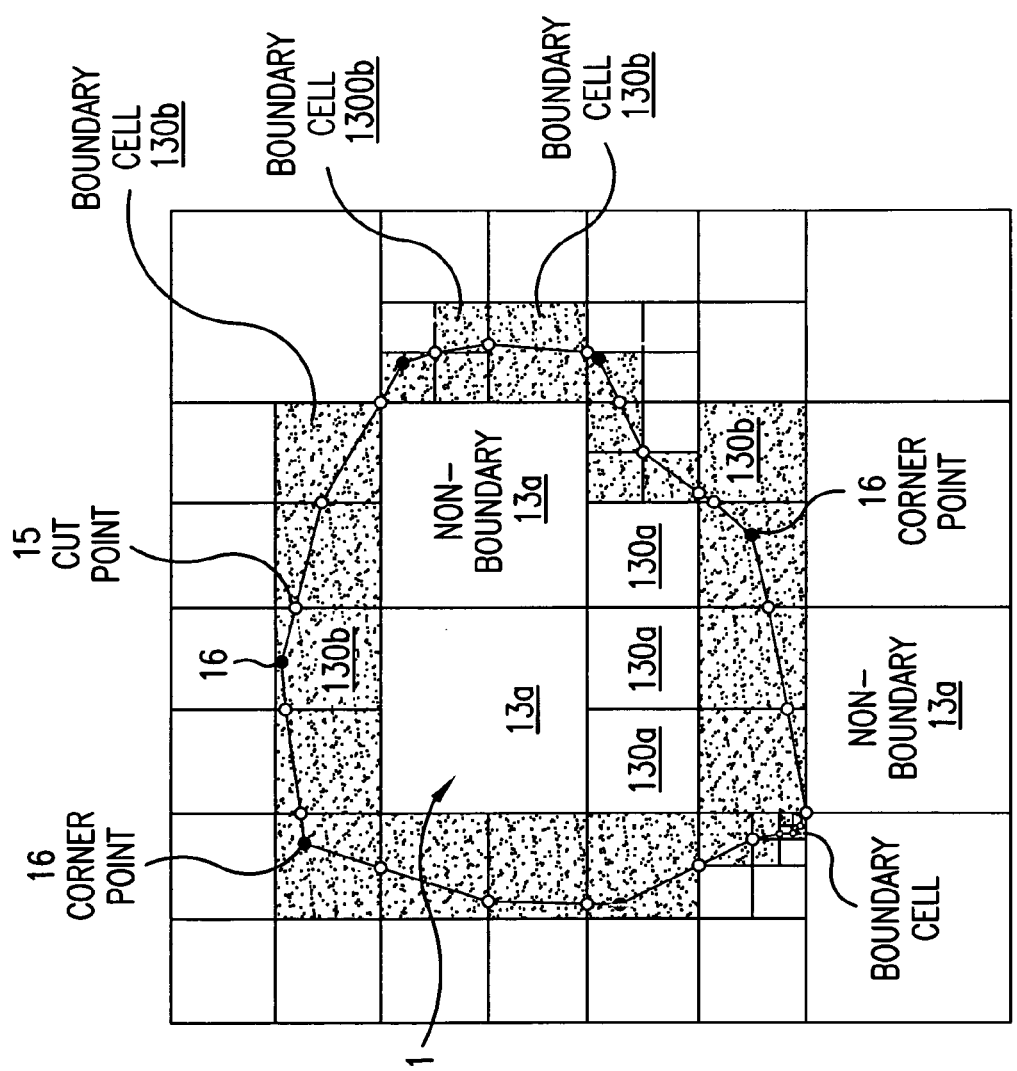
FIG. 4 is a schematic diagram showing the Octree division method according to the present invention (in two dimensions).

FIG. 4 is a schematic diagram showing the division method according to the present invention in two dimensions. According to the present invention, in the Octree division step (B) described above, each of the divided cells 13, 130, 1300 is classified as either a non-boundary cell such as 13a, 130a located in the interior of the object or in the region outside of the object, or as a boundary cell, such as 130b, 1300b, that includes the boundary surfaces.

That is, the present invention uses a modified Octree for representing boundary cells such as 130b, 1300b, wherein a cell included wholly in the interior of the boundary or wholly in a region outside of the boundary is a non-boundary cell, such as cells 13a, 130a, which are cubes of largest size. On the other hand, in accordance with the present invention, a cell having boundary information from the external data 12 contained therein is a boundary cell such as cells 130b, 1300b. Each boundary cell, such as 130b, 1300b, can be strictly or approximately replaced by cut points 15 (shown by open circles in FIG. 4) on twelve ridge lines in three dimensions, and on four ridge lines in two dimensions.

The boundary cells are Octree-divided until cut points 15 are acquired sufficient to reconstruct the boundary shape elements making up a boundary included in the external data 12. The boundary shape elements may be strictly reconstructed for an analyzed curved surface such as a plane and quadratic surface, and approximately reconstructed for a boundary shape element represented by another free curved-surface and a discrete point group.

For example, when reconstructing a line segment, space will be Octree divided until two points on the line segment become the cut points 15 on the ridge line. For a plane, space will be Octree divided until three points become the cut points. Likewise, for a quadratic line, Octree division of space is performed until three points become the cut points, and for a quadratic surface Octree division of space is performed until four points become the cut points, respectively. In the same manner, for each of polynominal surfaces and rational surfaces, when the representative formulas of the external data are already known, space is hierarchically Octree divided until a necessary and sufficient number of cut points and ridge lines of the cells are found within the defined range.

In other words, the reconstructed position is divided until a cell satisfies designated resolution on the boundary area (i.e., surface area) or until the change rates of analysis results values (i.e., stress, distortion, pressure, flow rate, etc.) will be not greater than designated threshold values.

For the corner points 16 (shown by the blackened circles in FIG. 4) of a boundary cell, for example 130b, including a plurality of boundary shape elements, the corner points are not divided more than necessary because their internal boundaries can be indirectly expressed as lines of boundary intersection, which are represented by the cut points 15 possessed by adjacent boundary-cells. These boundary-cells have sufficient cut-points for reconstruction, and are divided until they are completely traversed by the boundary elements.

Therefore, V-CAD data 14 includes the following: information with respect to the shapes stored in the interiors of the cells; characteristics for representing the position of the cells, the number of cellular divisions, or resolution, for representing the degree of detail in the hierarchy; a pointer for representing adjacent cells; the number and coordinate values of cut points; and normal and curvature information related to the applications.

In addition, as V-CAD data, the lowest layer in the hierarchy holds node information and the results values in the manner of Euler. Furthermore, determination of threshold (i.e., allowable differences) with respect to the position of boundaries, normal lines, continuity of tangential lines, and each continuity of curvatures, are defined so that resolution by re-dividing may be maximized as much as possible.

Figure 5:
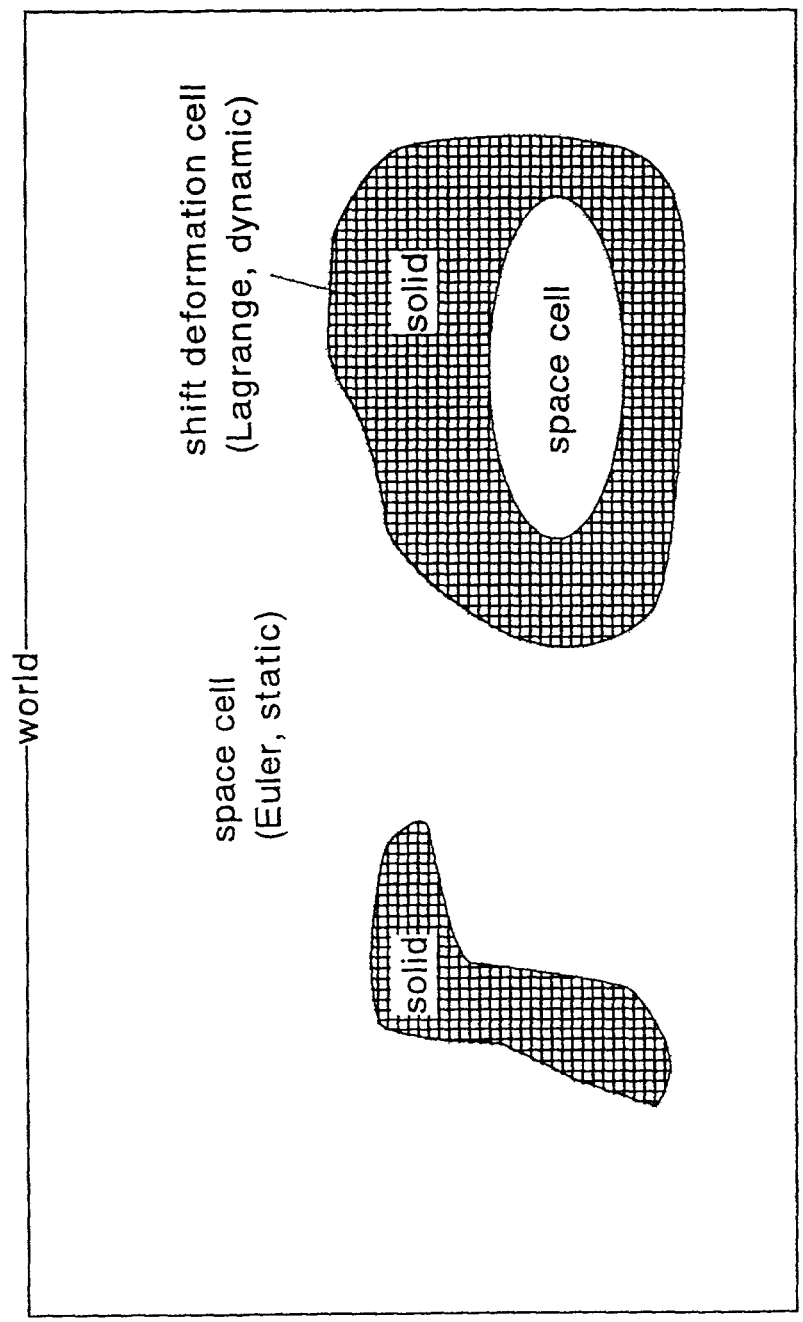
FIG. 5 is a schematic diagram showing attributes of each cell in accordance with the present invention.

FIG. 5 is a schematic diagram showing attributes of each cell in accordance with the present invention. A non-boundary cell, such as cell 13a described above, has one kind of physical property value as its attribute, whereas a boundary cell, such as cell 130b, has two kinds of physical properties which are related to the interior of the object and regions outside of the object.

In other words, although each cell is classified as either a non-boundary cell or a boundary cell, and further each cell (whether a non-boundary cell or a boundary cell) includes two kinds of space cells (utilized for reconstructing fluid, using Euler methods) and shift deformation cells (utilized for reconstructing solid, using Lagrange methods). For V-CAD, only boundary cells 13b have two attribute values, one corresponding to the attribute of the interior of the object and one corresponding to the attribute of the region outside of the object.

As an initial condition, a cell is considered a space fluid cell (Euler mesh) fixed in all space (world); but, for a solid, the cell is considered a shift deformation cell (Lagrange mesh) which can freely shift and deform in each simulation. One simulation result is retrieved into V-CAD and incorporated into the static world. At this time, boundary information can be used to reset resolution and the like. For the purpose of re-dividing/thinning out object cells after deformation, bi-directional mapping from orthogonal parameter space into a deformed hexahedoron is prepared for an object cell that does not depend on a coordinate system. Then, an up-and-down shift (i.e., a vertical shift) in the hierarchy is performed in the parameter space (i.e., an orthogonal Octree space), followed by re-mapping. Also, during reading input, it is necessary to correlate the simulation result with a space cell (i.e., indexing in space). In this way, a double data structure containing a Lagrange mesh in a Euler mesh is provided.

Further, the physical property values of each cell can be broadly classified into two groups of values: (1) constant values, given initially and not changed during simulation, and (2) variable values that may change based on the results of simulation.

Among examples of constant values are: material properties (i.e., stiffness coefficient, Young's modulus, yield value); the N value (i.e., the order of elongation in plastic deformation); tensile strength; Poisson's ratio (i.e., shearing strength); temperature; maching speed; friction properties (such as the characteristics of anti-friction, viscosity, shearing friction coefficient, and Coulomb friction); maching (boundary) condition (i.e., shift vector of tools, cooling speed).

Among examples of variable values are: for each cell, stress (i.e., symmetrical tensile amount having 6 variables) and distortion (i.e., symmetrical tensile amount having 6 variables) and the like; flow rate; pressure; temperature; and the like. In the simulation process, when a difference in variable values occurs that is larger than an allowable pre-designated value between adjacent non-boundary cells, The method of storing substantial data integrating shape and physical properties in accordance with the present invention is used for representing input, output, and intermediate analysis/simulation data, such as structure analysis of solids, large-deformation analysis (i.e., rigid plasticity and elastic plasticity analysis), heat and fluid analysis, flow analysis in C-simulation etc., in addition to shape definition, modification, display, hold, study, and evaluation of design based on S-CAD and the like. Furthermore, the method of storing substantial data integrating shape and physical properties in accordance with the present invention can also be used for generation, analysis, visualization, comparison and evaluation of data for removal processing, addition processing, deformation processing in A-CAM and D-fabrication, and measurement of the surface and interior of an object, data creation for instrumentation, hold of results, display, various analyses, and comparison and analysis with processed data. There are two kinds of display methods for displaying processed data in accordance with the present invention: surface rendering and volume rendering.

Table 1 compiles characteristics comparing V-CAD in accordance with the present invention with S-CAD. From Table 1, it can be seen that V-CAD in accordance with the present invention is superior to S-CAD in many respects.

TABLE 1

|  | Adaptability to Simulation | Adaptability to machining | Stability of data | Controllability | Accuracy | Distibutability |
|---|---|---|---|---|---|---|
| S-CAD system | X (acceptance of mesh generation time information: X) | Δ (sending and receiving of data: X, geometric information only) | X (weak in conversion) | Δ (skill required) | Δ (time required) | ○ |
| V-CAD system | ○ (built in) | ○ | ○ | Δ (repairable due to multiple nature) | Δ (challenge to development) | ○ (multiple resolution) | Differentiation activation | re-division is automatically performed according to the above described Octree division method until the difference decreases and falls within the allowable pre-designated value.

Method of Automatically Determining Resolution

With regards to automatic determination of resolution, in addition to the method based constraints arising from shapes and the disparity in physical properties between adjacent cells as already described, there are constraints determined by the memory size and computing time required for processing, and constraints arising from pre-designated absolute accuracy settings. For example, the pre-designated absolute accuracy may be constrained so that when the cell width is 1 μm, further Octree division is stopped. When any one of all these above listed constraints is satisfied, the Octree division of space is stopped. This condition can provide representation having necessary and minimal resolution, thereby making implementation more practical.

Method of Making Full Use of V-CAD Data

Figure 6:
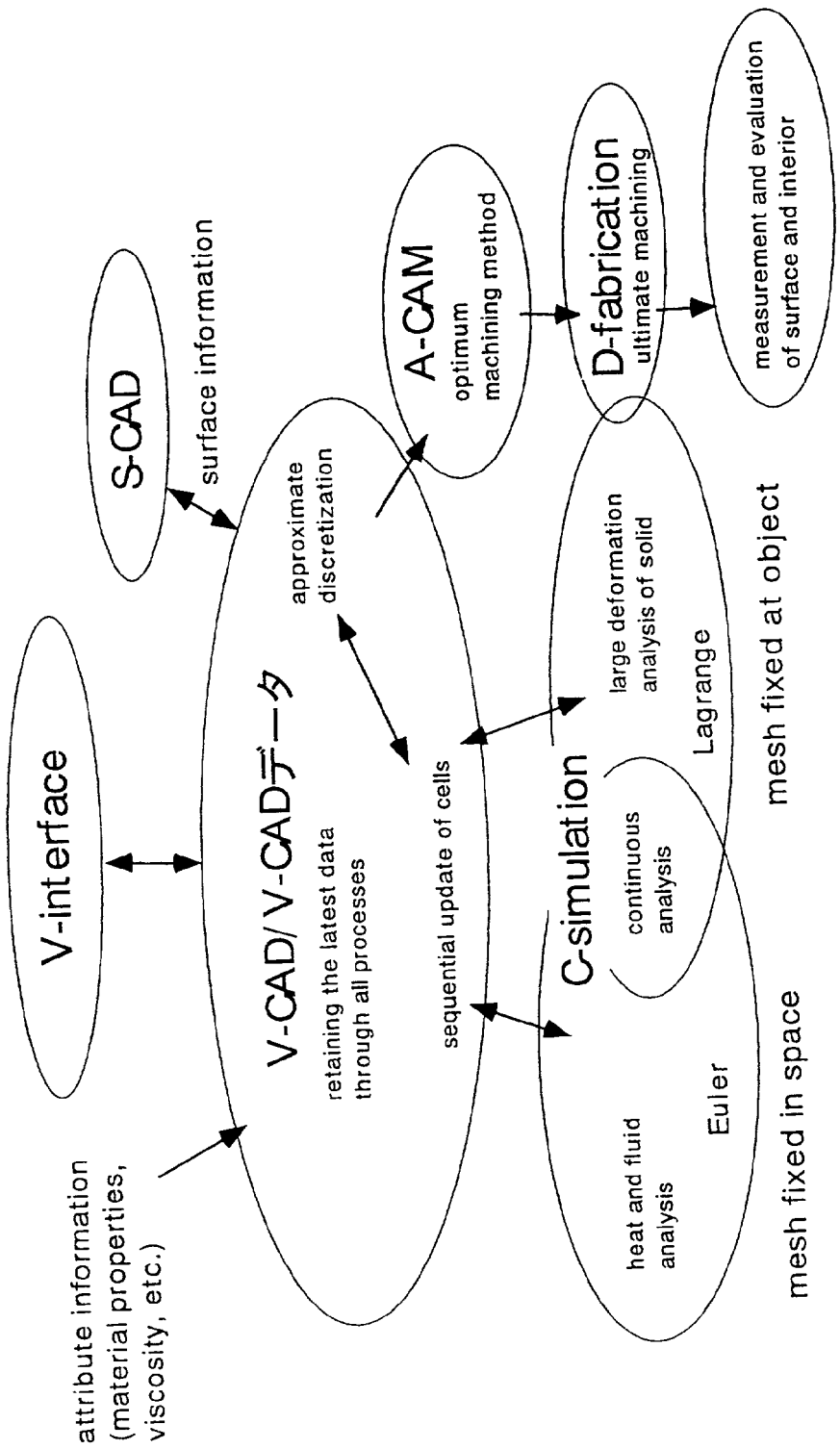
FIG. 6 is a schematic Venn diagram showing the relationship between V-CAD and V-CAD data according to the present invention and other simulation means.

FIG. 6 schematically shows the relationship between V-CAD and V-CAD data in accordance with the present invention to the V-interface, S-CAD, A-CAM, D-fabrication, and C-simulation.

Figure 7A:
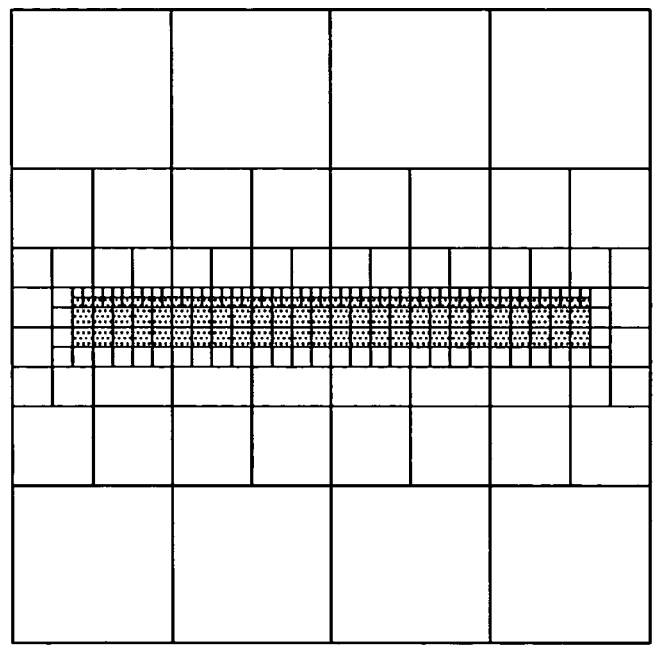
FIGS. 7A and 7B are schematic diagrams showing the comparison of the division method according to the present invention (referred to as "modified Octree" division) in FIG. 7B with the conventional Octree division of FIG. 7A.
Figure 7B:
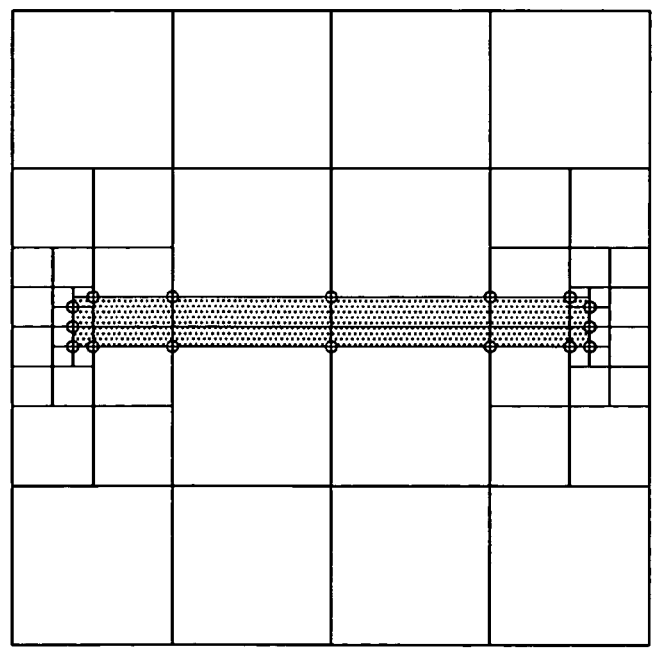

FIGS. 7A and 7B are two dimensional schematic diagrams such as shown in FIG. 4, and provides a comparisons of the division method according to the present invention (i.e., the modified Octree method) with the conventional Octree. FIG. 7A illustrates a conventional Octree, and FIG. 7B shows an example of modified Octree performed in accordance with the present invention. This comparative example demonstrates the case of division of a thin board (i.e., the portion with scattered dots in FIGS. 7A and 7B), which is a hard object for a space division method, such as conventional Octree, to deal with.

From these FIGS. 7A and 7B, it can be appreciated that the modified Octree, according to the present invention, requires less division than the conventional Octree, because modified Octree uses the cut point-based reconstruction of a surface.

According to the method of storing substantial data integrating shape and physical properties in accordance with the present invention, by using V-CAD and V-CAD data, the integration of CAD and simulation can be utilized as a tool for design. Also, the present method of storing substantial data integrating shape and physical properties can be integrated with CAM, which is a tool for processing. Furthermore, the present method of storing substantial data integrating shape and physical properties has usefulness and novelty as a modeling technique for more generally representing a real world object in a computer. In this way, shape and physical properties, each conventionally separated, can be integrated and thus the real world "object" can be represented as an "object" in terms of substantial data. Thus, the storage method of the present invention, as fully described above, has the potential for use in development that leads to integration of artifact and natural matter.

Although solid CAD is mainstreaming as a tool for design as described above, volume CAD may now provide the basis for design in next generation in view of the presently described method of storing substantial data integrating shape and physical properties. Volume CAD perfectly integrates CAD and simulation, enabling more efficient management of each process of design, analysis, machining, assembly, test, and the like utilizing the same data. Also, it becomes possible to incorporate natural matter, such as a human body, into design and analysis, as well as artifact, thereby treating the natural matter "as is."

Therefore, the method of storing substantial data integrating shape and physical properties, in accordance with the present invention, can store the substantial data integrating shape and physical properties in a small storage capacity. Consequently, the management of shape, structure, physical-property information, and history of matter, becomes possible in a unified way. Likewise, the management of data associated with a series of processes from design to work, assembly, test, evaluation, and the like processes, becomes possible while using the same data, which enables the integration of CAD and simulation. Therefore, the storage method according to the present invention plainly has superior advantages.

Further, it is evident that the present invention is not limited to the specific implementation forms and embodiments as described above, but various modifications can be made without departing from the subject matter of the present invention. For example, the removable electrode according to the present invention is not limited to those used for electrolytic dressing grinding, such as shown in FIG. 1. In other words, the present invention can be applied to any electrode for electrolytic dressing grinding.

The invention claimed is:

1. A method of storing substantial data integrating shape and physical properties, comprising the following steps:
    an external data input step (A) for inputting external data consisting of boundary data of an object;
    an Octree division step (B) for dividing, by modified Octree division, the external data into cubical divided cells with boundary surfaces orthogonal to each other, wherein each divided cell is classified as only one member of the group consisting of (1) a non-boundary cell not including a boundary surface of the object and located in the interior or in the outside region of the object, and (2) a boundary cell including the boundary surface of the object, wherein the modified Octree division comprises the steps of:
        i. re-dividing by Octree division only boundary cells, wherein each boundary cell is divided into smaller cells, and each smaller cell is then classified as either a non-boundary cell or a boundary cell; and
        ii. acquiring cut points by replacing each boundary cell, either strictly or approximately, by cut points on twelve ridge lines in three dimensions and on four ridge lines in two dimensions, wherein re-division of only boundary cells is performed until sufficient cut points are acquired to reconstruct boundary shape elements, including boundary surfaces, included in the external data; and
    a cell data storage step (C) for storing the values of physical properties for each of the cells.

2. The method of storing substantial data integrating shape and physical properties according to claim 1, wherein each non-boundary cell has one kind of physical property value as an attribute, and each boundary cell has two kinds of physical property values relating respectively to the interior of the object and to regions outside of the object.

3. The method of storing substantial data integrating shape and physical properties according to claim 1, wherein physical property values consist of constant values which do not change by simulation, and variables which change as a result of simulation.

4. The method of storing substantial data integrating shape and physical properties according to claim 1, wherein the external data is selected from the group consisting of polygon data representing a polyhedron element, a tetrahedron element or a hexahedron element for a finite-element method, curved surface data for a three dimensional CAD or CG tool, and data for representing the surface of another solid as information comprising partial planes and curved surfaces.

5. A method of storing substantial data integrating shape and physical properties, comprising the following steps:
    inputting to a computer external data consisting of boundary data of an object;
    dividing, by modified Octree division, the external data into cubical first cells with boundary surfaces orthogonal to each other, wherein each first cell is classified as only one member of the group consisting of (1) a non-boundary cell not including a boundary surface of the object and located in the interior or the outside region of the object, and (2) a boundary cell including the boundary surface of the object, wherein the modified Octree division comprises the steps of:
        i. re-dividing by Octree division only boundary cells, wherein each boundary cell is divided into smaller cells, and each smaller cell is then classified as either a non-boundary cell or a boundary cell; and
        ii. acquiring cut points by replacing each boundary cell, either strictly or approximately, by cut points on twelve ridge lines in three dimensions and on four ridge lines in two dimensions, wherein re-division of only boundary cells is performed until sufficient cut points are acquired to reconstruct boundary shape elements, including boundary surfaces, included in the external data; and
    storing the values of physical properties for each of the first cells.

6. The method of storing substantial data integrating shape and physical properties according to claim 5, wherein each non-boundary cell has one kind of physical property value as an attribute, and each boundary cell has two kinds of physical property values relating respectively to the interior of the object and to regions outside of the object.

7. A method of storing substantial data integrating shape and physical properties according to claim 5, wherein physical property values consist of constant values that do not change by simulation and variables that change as a result of simulation.

8. A method of storing substantial data integrating shape and physical properties according to claim 5, wherein the external data is selected from the group consisting of polygon data representing a polyhedron element, a tetrahedron element or a hexahedron element for a finite-element method, curved surface data for a three dimensional CAD or CG tool, and data for representing the surface of another solid as information comprising partial planes and curved surfaces.

9. A method of storing substantial data integrating shape and physical properties according to claim 5, wherein each first cell that is a boundary cell is divided by modified Octree division into cubical second cells with boundary surfaces orthogonal to each other, and each second cell is classified as only one member of the group consisting of (1) a non-boundary second cell not including the boundary surface of the object and located in the interior or in the outside region of the object, and (2) a boundary second cell including the boundary surface of the object.

10. A method of storing substantial data integrating shape and physical properties according to claim 9, wherein each second cell that is a boundary cell is divided by modified Octree division into cubical third cells with boundary surfaces orthogonal to each other, and each third cell is classified as only one member of the group consists of (1) a non-boundary third cell not including the boundary surface of the object and located in the interior or in the outside region of the object, and (2) a boundary third cell including a boundary surface of the object; and
the method further includes the step of:
storing the values of physical properties for each of the second cells and each of the third cells.

11. The method of storing substantial data integrating shape and physical properties according to claim 10, wherein each non-boundary cell has one kind of physical property value as an attribute, and each boundary cell has two kinds of physical property values relating respectively to the interior of the object and to regions outside of the object.

12. A method of storing substantial data integrating shape and physical properties according to claim 11, wherein physical property values consist of constant values that do not change by simulation and variables that change as a result of simulation.

13. A method of storing substantial data integrating shape and physical properties according to claim 12, wherein the external data is selected from the group consisting of polygon data representing a polyhedron element, a tetrahedron element or a hexahedron element for a finite-element method, curved surface data for a three dimensional CAD or CG tool, and data for representing the surface of another solid as information comprising partial planes and curved surfaces.

14. A method of storing substantial data integrating shape and physical properties according to claim 13, further comprising the step of:
expressing corner points by cut points possessed by adjacent boundary cells.

15. A method of storing substantial data integrating shape and physical properties, comprising the following steps:
(a) inputting to a computer external data consisting of boundary data of an object;
(b) dividing, by modified Octree division, the external data into cubical first cells with boundary surfaces orthogonal to each other, wherein each first cell is classified as only one member of the group consisting of (1) a non-boundary cell not including a boundary surface of the object and located in the interior or the outside region of the object, and (2) a boundary cell including the boundary surface of the object, wherein the modified Octree division comprises the steps of:
  i. re-dividing by Octree division only boundary cells, wherein each boundary cell is divided into smaller cells, and each smaller cell is then classified as either a non-boundary cell or a boundary cell; and
  ii. acquiring cut points by replacing each boundary cell, either strictly or approximately, by cut points on twelve ridge lines in three dimensions and on four ridge lines in two dimensions, wherein re-division of only boundary cells is performed until sufficient cut points are acquired to reconstruct boundary shape elements, including boundary surfaces, included in the external data; and
(c) storing the values of physical properties for each of the first cells, wherein each non-boundary cell has one kind of physical property value as an attribute, and each boundary cell has two kinds of physical property values relating respectively to the interior of the object and to regions outside of the object;
wherein physical property values consist of constant values that do not change by simulation and variables that change as a result of simulation; and
wherein the external data is selected from the group consisting of polygon data representing a polyhedron element, a tetrahedron element or a hexahedron element for a finite-element method, curved surface data for a three dimensional CAD or CG tool, and data for representing the surface of another solid as information comprising partial planes and curved surfaces.

16. A method of storing substantial data integrating shape and physical properties according to claim 15, further comprising the step of:
expressing corner points by cut points possessed by adjacent boundary cells.

* * * * *